(12) United States Patent
Tomita

(10) Patent No.: US 6,344,682 B1
(45) Date of Patent: Feb. 5, 2002

(54) SEMICONDUCTOR DEVICE COMPRISING A SEMICONDUCTOR ELEMENT MOUNTED ON A SUBSTRATE AND COVERED BY A WIRING BOARD

(75) Inventor: Yoshihiro Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/354,586

(22) Filed: Jul. 16, 1999

(30) Foreign Application Priority Data

Feb. 1, 1999 (JP) .......................................... 11-023838

(51) Int. Cl.[7] ........................ H01H 23/02; H01L 23/12; H01L 23/14; H01L 23/53; H01L 23/48; H01L 23/52

(52) U.S. Cl. ........................ 257/686; 257/685; 257/701; 257/702; 257/723; 257/737; 257/780; 257/778; 257/724

(58) Field of Search ........................ 257/685, 723–724, 257/778, 780, 713, 783, 686, 702, 704

(56) References Cited

U.S. PATENT DOCUMENTS 5,276,289 A * 1/1994 Satoh et al. ................ 174/260
5,798,567 A * 8/1998 Kelly et al. ................. 257/723
5,854,507 A * 12/1998 Miremadi et al. .......... 257/686
5,869,894 A * 2/1999 Degani et al. .............. 257/723
5,936,843 A * 8/1999 Ohshima et al. ............ 361/760
5,969,944 A * 10/1999 Borkar et al. ............... 361/699
5,994,166 A * 11/1999 Akram et al. ............... 438/108
6,025,648 A * 2/2000 Takahashi et al. .......... 257/778

FOREIGN PATENT DOCUMENTS

JP 405074989 * 3/1993 .................... 23/36
JP 5-95053 4/1993

* cited by examiner

Primary Examiner—Tom Thomas
Assistant Examiner—Nitin Parekh
(74) Attorney, Agent, or Firm—McDermott, Will & Emery

(57) ABSTRACT

A semiconductor element is mounted on a main substrate with its primary surface downward, and the electrodes of the semiconductor element are connected to the electrodes of the main substrate. A wiring board having a wiring pattern is placed on the backside of the semiconductor element. Four corners of the wiring board are connected to the main substrate by means of connection pins. The connection pins are formed so as to become conductive to thereby electrically connect the wiring pattern of the main substrate to the wiring pattern of the wiring board.

3 Claims, 3 Drawing Sheets

US 6,344,682 B1

SEMICONDUCTOR DEVICE COMPRISING A SEMICONDUCTOR ELEMENT MOUNTED ON A SUBSTRATE AND COVERED BY A WIRING BOARD

BACKGROUND OF THE INVENTION

1. Field of the Invention

The present invention relates to a semiconductor device, and more particularly, to a semiconductor device formed by an improved method of mounting a semiconductor element on a substrate.

2. Background Art

FIG. 5 is a cross-sectional view showing one example of a conventional semiconductor device. In FIG. 5, reference numeral 1 designates a semiconductor element; and reference numeral 2 designates a main substrate. The semiconductor element 1 is electrically connected to the main substrate 2 by means of a connection terminal 3 and sealed by a sealing material 4. Reference numeral 6 designates an adhesive resin or a brazing filler material; and 11c designates a case for protecting the semiconductor element 1. The case 11c is fixed or caused to adhere to the semiconductor element 1 by use of the adhesive resin 6. Reference numeral 12c designates an adhesive resin or abrazing filler material. A leg portion of the case 11c is bonded to the periphery of the main substrate 2 by means of the adhesive resin 12c.

In the structure of the conventional semiconductor device, machining of the case 11c adds to the manufacturing cost of the semiconductor device. Further, such a structure makes it difficult to establish an electrical connection or a grounding connection to the semiconductor element 1.

The present invention is aimed at solving the problem set forth, and the object of the present invention is to provide a semiconductor device which has a simple structure and enables a reduction in manufacturing costs and an improvement in the reliability of a semiconductor element mounted in the semiconductor device.

SUMMARY OF THE INVENTION

According to one aspect of the present invention, a semiconductor device comprises a main substrate having electrodes on a primary surface thereof and a semiconductor element having electrodes on the primary surface thereof. The semiconductor element is mounted such that the primary surface of the semiconductor element faces the primary surface of the main substrate. The electrodes on the primary surface of the semiconductor element are electrically connected to the electrodes on the primary surface of the main substrate byway of connection terminals. A wiring board having a wiring pattern at least on the primary surface thereof is provided, and the wiring board is mounted such that the primary surface of the wiring board is brought into contact with or bonded to a reverse surface of the semiconductor element, and the wiring board extends beyond the periphery of the semiconductor element. Further, a plurality of connecting members are provided to connect between the wiring board and the main substrate along the periphery of the semiconductor element.

Other and further objects, features and advantages of the invention will appear more fully from the following description.

BRIEF DESCRIPTION OF THE DRAWINGS

FIG. 1A is a side view showing a wiring board and its relevant portions.

FIG. 1B is a bottom view showing the wiring board shown in FIG. 1A.

FIG. 1C is a cross-sectional view showing the semiconductor device.

FIG. 2A is a side view showing a wiring board and relevant portions thereof.

FIG. 2B is a cross-sectional view showing the semiconductor device.

DETAILED DESCRIPTION OF THE PREFERRRED ASPECTS OF THE INVENTION

Figure 1A:
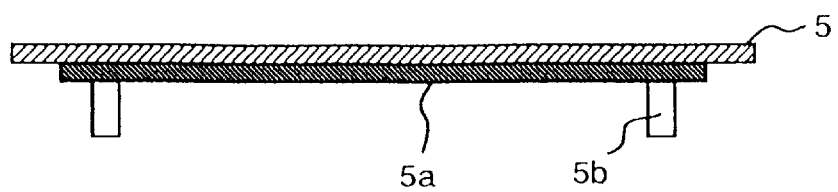
FIGS. 1A to 1C show a configuration of a semiconductor device according to a first aspect of the present invention.

Some aspects of the present invention will be described hereinbelow by reference to the accompanying drawings. Throughout the drawings, like reference numerals designate like or corresponding elements, and their explanations may be omitted or simplified.

First Aspect

Figure 1B:
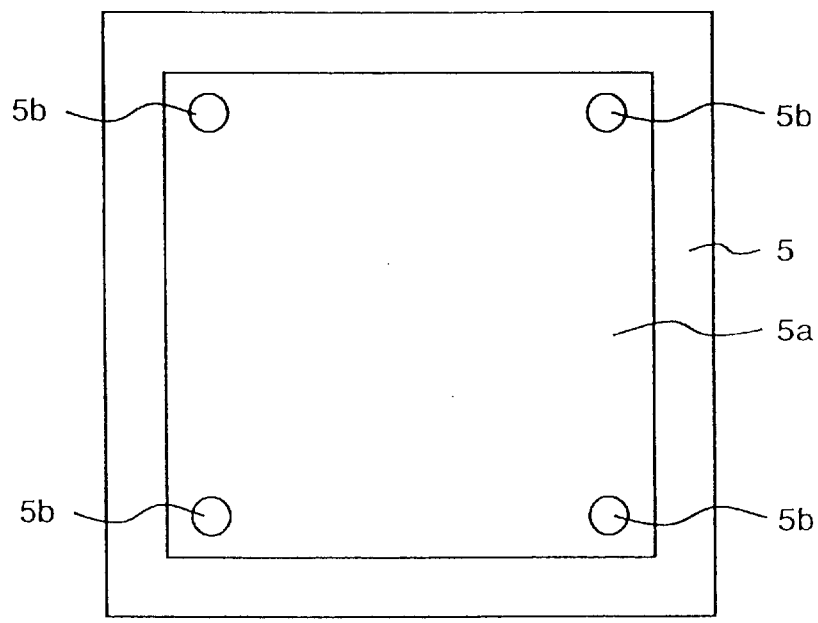
Figure 1C:
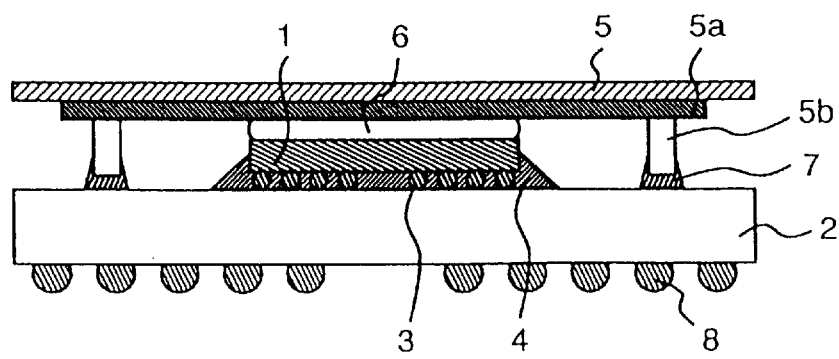

FIGS. 1A to 1C show a configuration of a semiconductor device according to a first aspect of the present invention. FIG. 1A is a side view showing a wiring board and its relevant portions; FIG. 1B is a bottom view showing the wiring board shown in FIG. 1A; and FIG. 1C is a cross-sectional view showing the semiconductor device.

In FIGS. 1A to 1C, reference numeral 1 designates a semiconductor element such as a semiconductor chip; 2 designates a main substrate such as a printed board; 3 designates a connection terminal formed on the primary surface of the semiconductor element 1; 4 designates a sealing resin such as an epoxy resin; 5 designates a wiring board such as another printed board; 5a designates a wiring pattern formed on the surface of the wiring board 5; 5b designates connecting members or support members such as connection pins; 6 designates an adhesive member such as an adhesive or a brazing filler material; 7 designates a connection section for connecting the connection pins 5b to the main substrate 2; and 8 designates external terminals of the main substrate 2.

Referring to FIG. 1C, the semiconductor element 1 has some electrodes (not illustrated) on the primary surface (downward direction in the drawing). The main substrate 2 has some electrodes or a wiring pattern (not illustrated) on the primary surface (upward direction in the drawing). The primary surface of the semiconductor element 1 is directed toward a downward direction in the drawing. The electrodes of the semiconductor element 1 are electrically connected to the electrodes or wiring pattern of the main substrate 2 by means of the connection terminal 3.

As shown in FIGS. 1A and 1B, a wiring pattern 5a is formed on the primary surface of the wiring board 5 (facing the downward direction in FIG. 1), and four support members (i.e., connection pins) 5b are provided in upright positions at the respective four corners.

As shown in FIG. 1C, the wiring board 5 is provided on the main substrate 2 such that the primary surface of the wiring board 5 faces the primary surface of the main substrate 2 (i.e., the primary surface of the wiring board 5 faces the downward direction in the drawing). The lower end of each of the support member 5b is bonded to the main substrate 2 by means of the connection section 7, which comprises, for example, epoxy resin or solder.

At the same time, the space between the wiring pattern 5a formed on the primary surface of the wiring board 5 and the reverse surface (i.e., the upper surface in the drawing) of the semiconductor element 1 is filled with the adhesive member 6, which comprises, for example, epoxy resin. The wiring board 5 is bonded or fixed to the semiconductor element 1 by means of the adhesive member 6.

The external terminals 8 are provided on the reverse surface (i.e., the lower surface) of the main substrate 2 and are used for establishing electrical connection when the main substrate 2 is further mounted on other board or substrate (not shown).

The semiconductor device according to the first aspect is constructed in such a manner as mentioned above. However, if the wiring board 5 has stiffness sufficient to protect the semiconductor element 1, the adhesive member 6 used for fixing the semiconductor element 1 to the wiring board 5 may be omitted.

In the first aspect, solder or organic material susceptible to becoming less elastic at the temperature—at which the semiconductor element 1 is mounted on the main substrate 2—may be used as the material of the connection section 7 between the support members 5b and the main substrate 2. Thereby, stress may be mitigated, which would otherwise be imposed on the semiconductor element 1 at the time of further mounting the main substrate 2 on other board.

In the first aspect, the wiring pattern 5a of the wiring board 5 is formed on the primary surface of the wiring board 5, and the geometry of the wiring pattern 5a is considered to be selected so as to suit a desired semiconductor device. A wiring pattern is formed even on the primary surface of the main substrate 1 and is considered to be subject to proper selection. In such a case, the positions on the wiring board 5 where the support members 5b are fixed or the positions on the main substrate 2 where the support members 5b are mounted can be readily changed so as to suit a desired semiconductor device. The number of support members 5b can be changed, as required.

Figure 5:
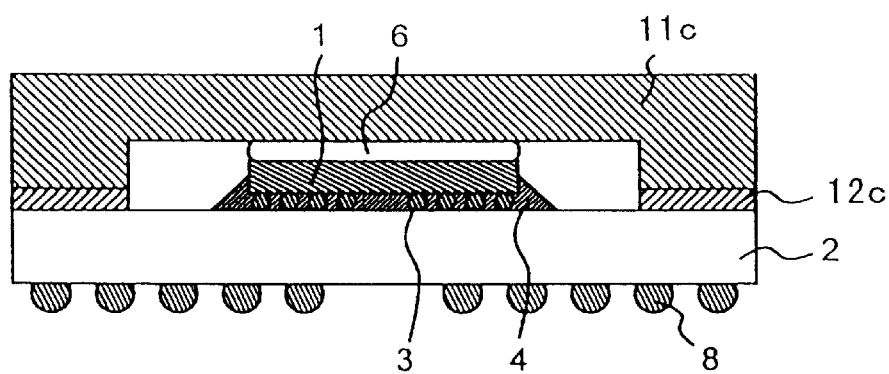
FIG. 5 is a cross-sectional view showing one example of a conventional semiconductor device.

In the first aspect, the necessity for machining a case member such as the protective case 1 for protecting the semiconductor element 1, which has been described with reference to FIG. 5, may be eliminated, thereby rendering the structure of the semiconductor device less expensive. Further, the reverse surface of the semiconductor element 1, such as a semiconductor chip, can be sufficiently protected.

In the first aspect, an organic material, ceramic, metal, or the like, may be used as the material of the wiring board 5.

The wiring pattern 5a of the wiring board 5 may be provided on one side (either the primary or reverse side) or on both sides of the wiring board 5. Further, the wiring pattern 5a may also be formed into a multilayer substrate.

The external terminals 8 provided on the reverse surface of the main substrate 2 may be omitted, and another semiconductor element may be mounted on the main substrate 2.

As has been mentioned above, according to the first aspect, there is produced a semiconductor device capable of protecting the semiconductor element 1 mounted on the main substrate 2 by means of a simple structure.

Second Aspect

Figure 2A:
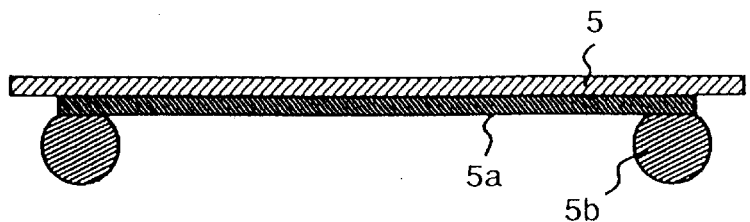
FIGS. 2A and 2B are illustrations showing the configuration of a semiconductor device according to a second aspect of the present invention.
Figure 2B:
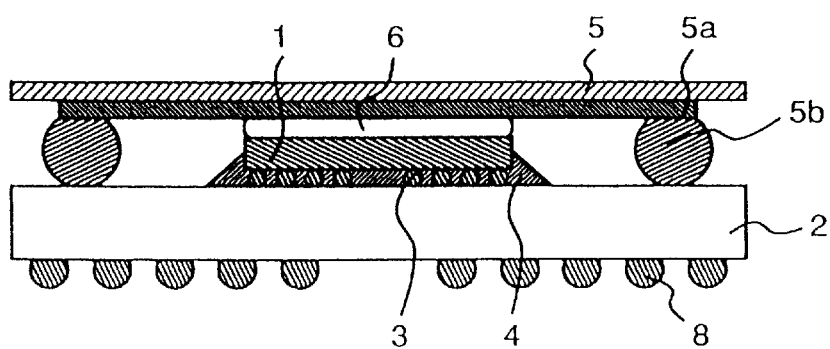

FIGS. 2A and 2B are illustrations showing the configuration of a semiconductor device according to a second aspect of the present invention. FIG. 2A is a side view showing a wiring board and relevant portions thereof; and FIG. 2B is a cross-sectional view showing the semiconductor device.

In FIGS. 2A and 2B, the support members 5b is comprised of material susceptible to becoming less elastic at the temperature at which the semiconductor element 1 is mounted on the substrate. A typical example for the material is a solder ball. The support members 5b enable the wiring board 5 to be connected to and mounted on the main substrate 2 at the four corners of the semiconductor element 1.

As mentioned above, when the support members 5b are formed into solder balls, the support members 5b are positioned such that the solder balls come into contact with wiring patterns or metallic portions provided on the respective surface of the wiring board 5 and the main substrate 2.

In the second aspect, only the solder balls serve as both support members and connection members, thus rendering the structure and manufacture of the semiconductor device simple.

In the semiconductor device according to the second aspect having the foregoing structure, the entire support section such as solder balls is susceptible to becoming less elastic at the temperature at which the semiconductor element 1 is mounted. As a result, there can be mitigated stress, which would otherwise be imposed on the semiconductor element 1 at the time of further mounting the main substrate 2 on another substrate.

The solder ball may be formed from any material, e.g., Sn—Ag or Pb/Sn solders such as Pb-63Sn or Pb-5Sn. Further, high-melting solder may be included between at the portion of the wiring board 5 and the connection section 7 (see FIG. 1C) by use of another solder having a different fusing point such as Pb-63Sn.

As has been mentioned above, according to the second aspect, there is produced a semiconductor device which has a simple structure, and is easy to manufacture, and does not impair the characteristics of a semiconductor element to be mounted.

Third Aspect

Figure 3:
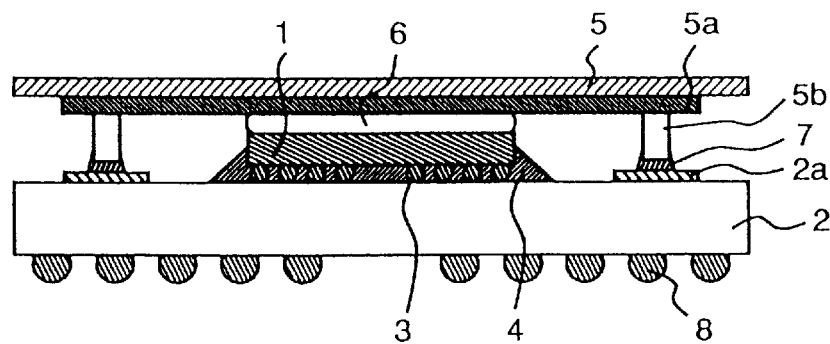
FIG. 3 is a cross-sectional view of a semiconductor device according to a third aspect of the present invention.

FIG. 3 is a cross-sectional view of a semiconductor device according to a third aspect of the present invention, and shows the structure thereof.

In FIG. 3, reference numeral 2a designates a wiring pattern laid on the primary surface of the main substrate 2, i.e., on the surface of the main substrate 2 on which the semiconductor element 1 is to be mounted.

The upper ends of the connection pins 5b are electrically connected to the wiring pattern 5a of the wiring board 5, and the lower ends of the same are electrically and mechanically connected to the wiring pattern 2a of the main substrate 2 by way of the conductive connection section 7. Although the wiring pattern 2a is provided at least at the locations where the wiring pattern 2a is connected to the support members 5b, the wiring pattern 2a may not be provided in the other locations on the main substrate 2.

In the third aspect, the wiring pattern 5a provided on the primary surface of the wiring board 5 (i.e. the side to face the semiconductor element 1) is primarily connected to the wiring pattern 2a of the main substrate 2. If the wiring pattern 2a of the main substrate 2 serves as a ground line, the number of wiring patterns provided on the main substrate 2 may be reduced, which in turn contributes to prevention of noise. Further, if the wiring pattern 2a of the main substrate 2 is taken as a power supply pin, a similar advantageous result is yielded.

Further, the support members 5b may be used as signal pins for transmitting signals. In this case, the wiring pattern 5a is provided on the primary surface of the wiring board 5, i.e., on the surface to face the semiconductor element 1.

The support members 5b serving as the connection member are formed into solder balls such as those described in the second aspect shown in FIG. 2, and still the similar advantageous results are yielded.

As described above, according to the third aspect, there can be manufactured a semiconductor device which has a simple structure, and is easy to manufacture, and enables the main substrate 2 to be electrically connected to the wiring board 5.

Fourth Aspect

Figure 4:
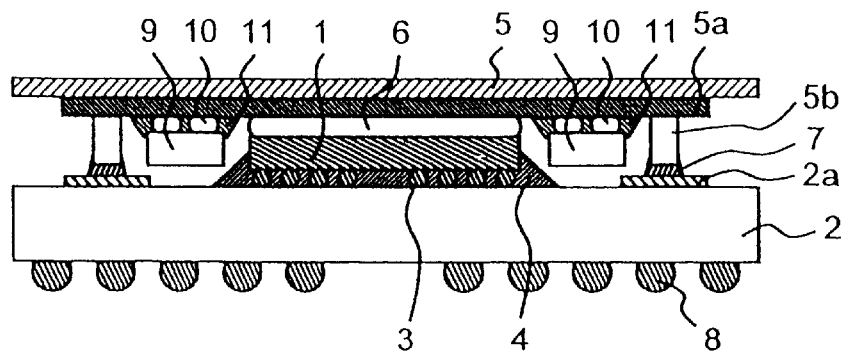
FIG. 4 is a cross-sectional view of a semiconductor device according to a fourth aspect of the present invention.

FIG. 4 is a cross-sectional view of a semiconductor device according to a fourth aspect of the present invention, and shows the configuration thereof.

In FIG. 4, reference numeral 9 designates circuit elements such as resistors or capacitor mounted on the wiring pattern 5a of the wiring board 5; 10 designates connection terminals for connecting the circuit elements 9 to the wiring pattern 5a; and 11 designates sealing resin (or coating resin) for protecting the connection terminals 10.

In FIG. 4, circuit elements 9 are connected to the wiring board 5 by way of connection terminals 10 and can be further electrically connected to the wiring pattern 2a of the main substrate 2 by way of the support members 5b. Such a circuit configuration enables impedance matching between electronic circuits and realizes superior circuit characteristics.

Even if the support member 5b serving as the connection member is formed into solder ball as in the second aspect, a similar advantageous result will be yielded.

As mentioned above, according to the fourth aspect, the circuit elements 9 can be mounted on the wiring board 5 and can be further electrically connected to the main substrate 2 by way of the support members 5b, thereby improving circuit characteristics of the semiconductor device.

The effects and advantages of the present invention may be summarized as follows.

According to a first aspect of the present invention, there can be provided a semiconductor device which is simple in structure and is capable of protecting a semiconductor element mounted on a main substrate.

According to a second aspect of the present invention, there is produced a semiconductor device which is simple in structure, easy to manufacture, and prevents deterioration of the characteristics of a semiconductor element to be mounted.

According to a third aspect of the present invention, there can be produced a semiconductor device which is simple in structure, easy to manufacture, and enables establishment of electrical connection between a main substrate and a wiring board.

According to a fourth aspect of the present invention, circuit elements can be mounted on a wiring board and are electrically connected to a main substrate by way of support members, thereby improving circuit characteristics of the semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-23838, filed on Feb. 1, 1999 including specification, claims, drawings and summary, on which the Convention priority of the present application is based, are incorporated herein by reference in its entirety.

What is claimed is:

1. A semiconductor device comprising:

a main substrate having electrodes on a primary surface thereof;

a semiconductor element having electrodes on the primary surface thereof, said semiconductor element being mounted such that the primary surface of said semiconductor element faces the primary surface of said main substrate, said electrodes on the primary surface of the semiconductor element being electrically connected to said electrodes on the primary surface of said main substrate by way of connection terminals;

a wiring board having a wiring pattern only on the primary surface thereof, said wiring board being mounted such that the primary surface of said wiring board is brought into contact with or bonded to a reverse surface of said semiconductor element, said wiring board extending beyond the periphery of said semiconductor element;

a plurality of connecting members connected between said wiring board and said main substrate along the periphery of said semiconductor element; and an electric element mounted on the primary surface of said wiring board and is connected to the wiring pattern on the primary surface of said wiring board by way of a connection terminal.

2. The semiconductor device according to claim 1, wherein said connecting members are comprised of solder balls.

3. The semiconductor device according to claim 1, wherein a wiring pattern is laid on the primary surface of said main substrate, and said connecting members electrically connect said wiring pattern on said primary surface of said main substrate with the wiring pattern on the primary surface of said wiring board.

* * * * *